United States Patent [19]

Elgert et al.

[11] Patent Number: 5,465,032
[45] Date of Patent: Nov. 7, 1995

[54] VERTICAL DEFLECTION CIRCUIT

[75] Inventors: Achim Elgert, Bad Dürrheim; Thomas Hölzer, Schlangenbad, both of Germany

[73] Assignee: Deutsche Thomson-Brandt GmbH, Germany

[21] Appl. No.: 204,011

[22] Filed: Feb. 18, 1994

[30] Foreign Application Priority Data

Sep. 2, 1991 [DE] Germany .......................... 41 29 107.7

[51] Int. Cl.⁶ .............................. H01J 29/70; H01J 29/76
[52] U.S. Cl. .......................... 315/403; 315/387; 315/384; 315/397
[58] Field of Search ................................... 315/384, 403, 315/397, 384, 396, 397, 403

[56] References Cited

U.S. PATENT DOCUMENTS 5,089,755  2/1992  Wilber ...................................... 315/387

FOREIGN PATENT DOCUMENTS 3436304  4/1986  Germany .......................... H04H 3/16

OTHER PUBLICATIONS

Abstract of German 34 36 304 A1, pub. date Apr. 10, 1986.
IBM Technical Disclosure Bulletin vol. 31, No. 5 Oct. 1988 pp. 434–435 "Low Power Dissipation Vertical Deflection Circuit Using A Commercial Monolithic Integrated Circuit".
IBM Technical Disclosure Bulletin vol. 27 No. 3 Aug. 1984 pp. 1797–1798 "Active Frame Flyback Circuit For CRT".

Primary Examiner—Theodore M. Blum
Attorney, Agent, or Firm—Joseph S. Tripoli; Joseph J. Laks; Sammy S. Henig

[57] ABSTRACT

A vertical deflection circuit includes a first pin which receives a forward scanning voltage having a first level and a first frequency. During a flyback period a second pin receives a flyback voltage having a second level higher that the first level and a second frequency higher than the first frequency. A third voltage source provides a first pulse. A switch means selectively couples the first pin and the third voltage source in response to a vertical blanking signal. The vertical blanking signal is differentiated to provide a differentiated signal and a voltage divider applies the differentiated signal to the switch to apply the first pulse to the first pin.

8 Claims, 2 Drawing Sheets

VERTICAL DEFLECTION CIRCUIT

This is a continuation of PCT application PCT/EP 92/01933 filed Aug. 22, 1992 by Achim Elgert and Thomas Holzer and titled "VERTICAL DEFLECTION CIRCUIT".

This invention is directed to a vertical deflection circuit for a television receiver. In a vertical deflection circuit, the difference between the flyback voltage and the applied operating voltage must be a maximum of 50 volts. In the operation of a deflection circuit with a vertical deflection frequency of 100 Hz and a correspondingly shortened flyback time and an increased flyback voltage, the applied operating voltage has to be correspondingly increased. The operating voltage would then be greater than is actually needed for the forward scan and the heat dissipation of the whole circuit when operating at 100 Hz is considerably increased.

It is an object of the invention to provide a vertical deflection circuit which operates at an increased vertical deflection frequency, of 100 Hz for example, and with more rapid vertical flyback, without the heat dissipation increasing during the vertical forward scan.

During the flyback period, the flyback voltage which is applied to the IC is switched to a voltage which is greater than the operating voltage used during the forward scan period. The higher voltage switched to is adequate for operation at 50 Hz but cannot function without increasing the heat dissipation when operating at 100 Hz and a correspondingly shortened flyback period. With the invention, when operating at a vertical frequency of 100 Hz, the IC is able to function with the desired rapid change of current during the vertical flyback period without the heat dissipation during the vertical forward scan being increased. The second operating voltage is arbitrarily selected independently of the first operating voltage provided that the necessary conditions of operation are observed. In essence, these conditions are that the operating voltage is less than 42 volts and the difference between the flyback voltage and the operating voltage is to less than 50 volts.

The invention is explained with reference to the drawings in which.

Figure 1:
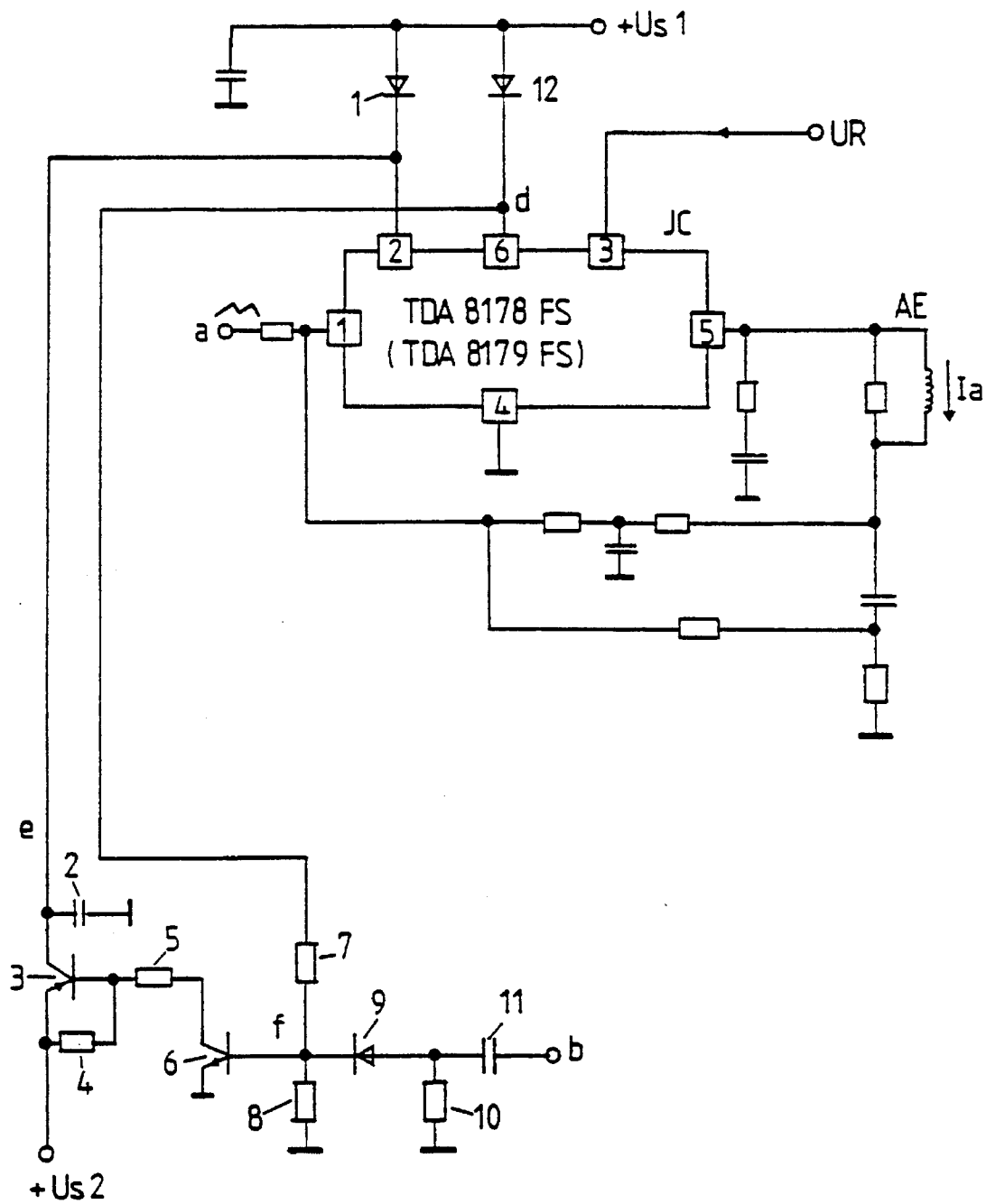
FIG. 1 shows the IC for the vertical deflection circuit including a known circuit and the peripheral circuit in accordance with the invention.
Figure 2:
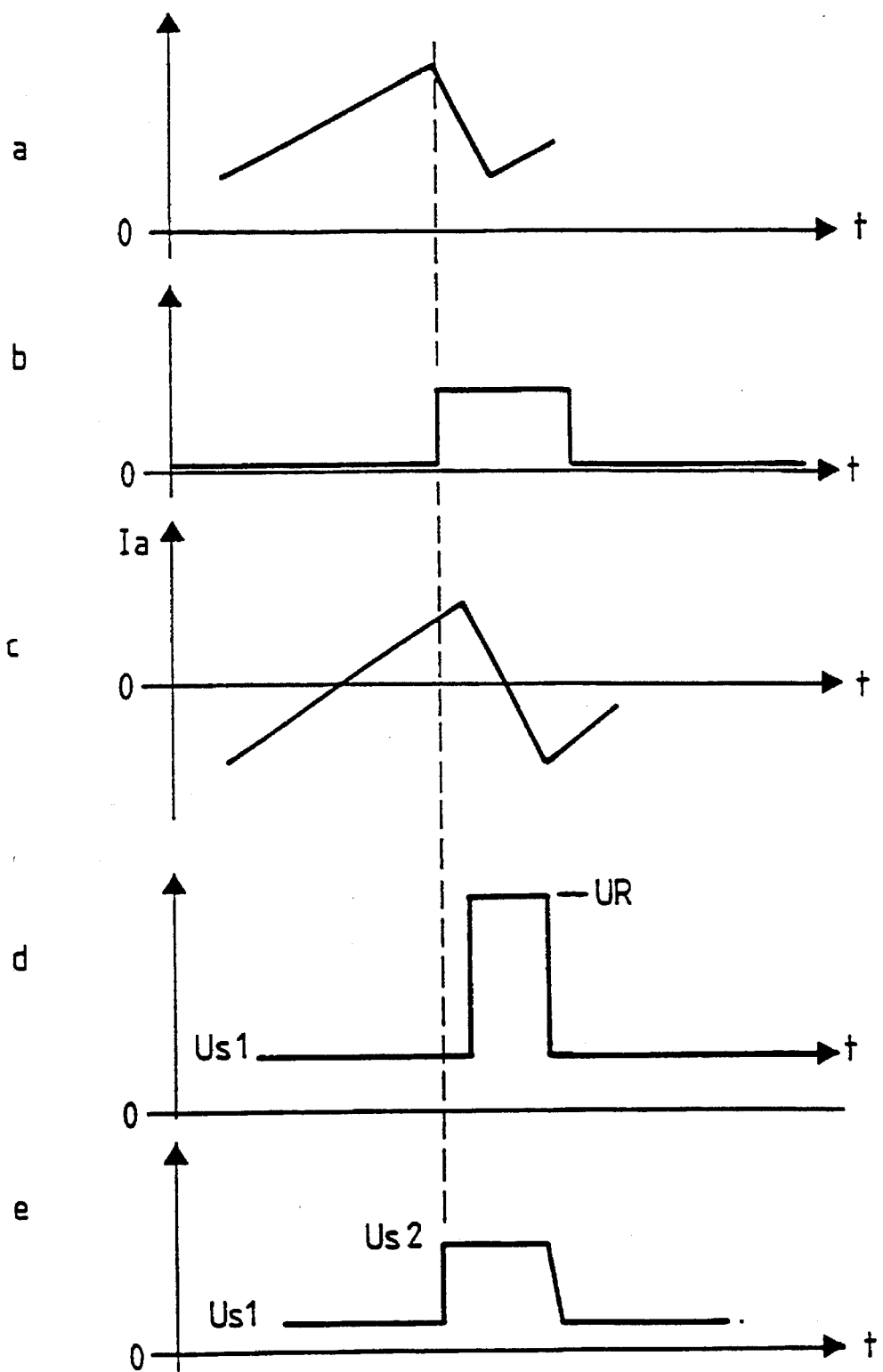
FIG. 2 shows the curves for explaining the method of operation of the circuit shown in FIG. 1.

In FIG. 2, the small letters "a" through "f" indicate those points in FIG. 1 at which the voltages and currents illustrated in FIG. 2 are present.

The vertical deflection circuit in accordance with FIG. 1 contains an IC of the type TDA 8178FS or TDA 8179FS. The vertical saw-toothed voltage "a" having a frequency of 100 Hz is applied to the pin 1. A pin 2 is connected via the decoupling diode 1 to the first operating voltage +Us1. A flyback operating voltage UR, which is greater than the first operating voltage Us1, is applied to the pin 3. The operating voltage, which is effective in the IC for the internal stages, is taken from the pin 2 during the forward scan and from the pin 3 during the flyback. The pin 5 is connected to the deflection unit AE and delivers the saw-toothed, vertical frequency deflection current Ia. The pin 6 carries the increased operating voltage UR during the flyback period and is connected via the decoupling diode 12 to the first operating voltage +Us1. The circuit described thus far is known and operates without any problems at a vertical frequency of 50 Hz.

For the operation at a vertical frequency of 100 Hz, the circuit is expanded by the additional circuitry including the components 2 through 11. This circuit operates in the following manner. The applied vertical blanking pulse "b", (FIG. 2) the leading edge of which occurs at the beginning of the trailing edge of the saw-toothed voltage "a", is differentiated by a differentiating member including a capacitor 11 and a resistor 10. Of the differentiated pulses, only the positive pulse is utilized by the diode 9, which pulse thus reaches the junction "f" of resistors 7 and 8 which form a voltage divider. This positive, differentiated pulse makes the transistor 6 conductive, which, thereupon, makes the transistor 3 conductive via the resistors 4, 5. Pin 2 is thereby connected to the higher operating voltage +Us2. The diode 1 is thereby rendered nonconductive and separates pin 2 from the operating voltage +Us1. Due to the internal functioning of the IC, the pin 6 adopts the value of the increased flyback operating voltage UR. The diode 12 is thereby rendered nonconductive and separates pin 6 from +Us1. The increased voltage extends from point "d" via the voltage divider composed of resistors 7 and 8 to the point "f" and thus maintains the transistor 6 conductive after the differentiated pulse has ended. Thus the transistor 3 also remains conductive and the increased operating voltage Us2 persists at the pin 2. The circuit, which connects the pin 2 to the increased operating voltage +Us2, is thus triggered by the differentiated pulse and is held thereafter by the pulse "d" from pin 6. The capacitor 2 causes the voltage "e", which is increased by the conductive transistor 3 from Us1 to Us2, to return to the value Us1 after a delay following the drop in the voltage on point "d" from UR to Us1.

What is claimed is:

1. A vertical deflection apparatus, comprising:

a source of a first supply voltage;

a source of a second supply voltage greater than said first supply voltage;

a deflection amplifier having first and second supply terminals for energizing first and second amplifier stages in a signal path of said amplifier, respectively;

a flyback generator for generating a flyback pulse voltage at said first supply terminal that is larger during a flyback interval than during a scan interval;

a source of a signal indicative of said flyback interval and coupled to a control terminal of a transistor switch for selectively coupling said second supply voltage to said second supply terminal, during said flyback interval, and for selectively coupling said first supply voltage to said second supply terminal, during said scan interval.

2. A vertical deflection apparatus according to claim 1 wherein said deflection amplifier is included in an integrated circuit of the type TDA 8178FS or TDA 8179FS.

3. An apparatus according to claim 1 wherein said flyback interval indicative signal is coupled to said control terminal via a first terminal of a voltage divider.

4. An apparatus according to claim 3 wherein said voltage developed at said first supply terminal is coupled to a second terminal of said voltage divider.

5. An apparatus according to claim 3 further comprising a diode coupled between said differentiator and an intermediate terminal of said voltage divider.

6. An apparatus according to claim 1 further comprising a capacitor having a first terminal coupled between a collector electrode of said transistor and said second supply terminal and a second terminal coupled to a common conductor.

7. An apparatus according to claim 1 further comprising a decoupling diode coupled between said source of said first supply voltage and said second supply terminal of said flyback generator.

8. An apparatus according to claim 1 wherein said source of said flyback interval indicative signal comprises a differentiator.

* * * * *